(12) United States Patent
Wang et al.

(10) Patent No.: US 11,307,498 B2
(45) Date of Patent: Apr. 19, 2022

(54) FILM PATTERNING METHOD, ARRAY SUBSTRATE, AND MANUFACTURING METHOD THEREOF

(71) Applicants: BOE Technology Group Co., Ltd., Beijing (CN); Hefei Xinsheng Optoelectronics Technology Co., Ltd., Anhui (CN)

(72) Inventors: Jun Wang, Beijing (CN); Guangcai Yuan, Beijing (CN); Dongfang Wang, Beijing (CN); Chong Fang, Beijing (CN); Guangyao Li, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 738 days.

(21) Appl. No.: 16/094,421

(22) PCT Filed: Mar. 26, 2018

(86) PCT No.: PCT/CN2018/080465
§ 371 (c)(1),
(2) Date: Oct. 17, 2018

(87) PCT Pub. No.: WO2019/015353
PCT Pub. Date: Jan. 24, 2019

(65) Prior Publication Data
US 2021/0223694 A1 Jul. 22, 2021

(30) Foreign Application Priority Data
Jul. 18, 2017 (CN) .......................... 201710585224.7

(51) Int. Cl.
*G03F 7/039* (2006.01)
*G03F 7/40* (2006.01)

(52) U.S. Cl.
CPC .............. *G03F 7/0392* (2013.01); *G03F 7/40* (2013.01)

(58) Field of Classification Search
CPC .......... G03F 7/40; G03F 7/0045; G03F 7/039; G03F 7/0392
See application file for complete search history.

(56) References Cited

U.S. PATENT DOCUMENTS 7,592,129 B2    9/2009  Watanabe
2006/0257785 A1  11/2006  Johnson
(Continued)

FOREIGN PATENT DOCUMENTS

CN    101435992 A        5/2009
CN    102455593 A   *    5/2012
(Continued)

OTHER PUBLICATIONS

English Machine Translation of Chu (CN102455593A) (Year: 2012).*
(Continued)

*Primary Examiner* — Peter L Vajda
*Assistant Examiner* — Nicholas E Brown
(74) *Attorney, Agent, or Firm* — Banner & Witcoff, Ltd.

(57) ABSTRACT

A film patterning method, an array substrate, and a manufacturing method of an array substrate are disclosed. The film patterning method includes: applying photoresist on a film to be patterned; performing exposure and development on the photoresist, a region corresponding to a completely removed portion of the photoresist after the exposure and the development being a first region; post-baking the photoresist, so that the photoresist is melted and collapsed to change the region corresponding to the completely removed portion into a second region, the photoresist after post-baking forms into a mask pattern; and patterning the film by using the mask pattern as a mask.

13 Claims, 2 Drawing Sheets

(56) References Cited

U.S. PATENT DOCUMENTS

| 2009/0130571 | A1 | 5/2009 | Piao et al. |
| 2010/0038649 | A1 | 2/2010 | Lee |
| 2011/0001138 | A1* | 1/2011 | Huang .................. H01L 27/124 |
| | | | 257/59 |
| 2017/0125546 | A1 | 5/2017 | Huang et al. |

FOREIGN PATENT DOCUMENTS

| CN | 102455593 A | 5/2012 |
| CN | 104330196 A | 2/2015 |
| CN | 104716092 A | 6/2015 |
| CN | 105527801 A | 4/2016 |
| CN | 107275195 A | 10/2017 |

OTHER PUBLICATIONS

Jul. 6, 2018—(WO) International Search Report and the Written Opinion Appn PCT/CN2018/080465 and English Translation.
Apr. 16, 2019—(CN) First Office Action Appn 201710585224.7 with English Translation.

* cited by examiner

FILM PATTERNING METHOD, ARRAY SUBSTRATE, AND MANUFACTURING METHOD THEREOF

The present application claims priority of China Patent application No. 201710585224.7 filed on Jul. 18, 2017, the content of which is incorporated in its entirety as portion of the present application by reference herein.

TECHNICAL FIELD

At least one embodiment of the present disclosure relates to a film patterning method, an array substrate, and a manufacturing method thereof.

BACKGROUND

In a manufacturing method of an array substrate, a process for patterning a film generally patterns the film by using photoresist as a mask. Therefore, the precision of the manufactured photoresist mask has a large impact on a pattern with small size to be formed on the film.

SUMMARY

At least one embodiment of the present disclosure provides a film patterning method, an array substrate and a manufacturing method thereof.

At least one embodiment of the present disclosure provides a film patterning method, including: applying photoresist on a film to be patterned; performing exposure and development on the photoresist, a region corresponding to a completely removed portion of the photoresist after the exposure and the development being a first region; post-baking the photoresist, so that the photoresist is melted and collapsed at a high temperature to change the region corresponding to the completely removed portion into a second region, the photoresist after post-baking forms into a mask pattern; and patterning the film by using the mask pattern as a mask.

For example, in some examples, a minimum size of the first region in a direction parallel to a plane where the film is located is a first size, a minimum size of the second region in the direction parallel to the plane where the film is located is a second size, and the second size is smaller than the first size.

For example, in some examples, the photoresist is positive photoresist.

For example, in some examples, a planar shape of the second region includes at least one selected from the group consisting of a circle and a line.

For example, in some examples, during the post-baking, the post-baking has a temperature of 150° C.-300° C. to cause the photoresist to melt and collapse at a high temperature.

For example, in some examples, during the post-baking, a time for the post-baking is 10 s-500 s.

For example, in some examples, during the post-baking, the time for the post-baking is 10 s-50 s.

For example, in some examples, the second size is 1 µm-2.9 µm.

For example, in some examples, the first size is not less than 3 µm.

For example, in some examples, the photoresist has a thickness of 0.5 µm-10 µm in a direction perpendicular to the film.

For example, in some examples, the thickness of the photoresist is 1.5 µm-2.2 µm in the direction perpendicular to the film.

For example, in some examples, a light intensity used in the exposure is 10 J/cm$^3$-500 J/cm$^3$.

At least one embodiment of the present disclosure provides a manufacturing method of an array substrate, including: providing a base substrate; forming a film to be patterned on the base substrate; and patterning the film by using the film patterning method according to any one of the abovementioned embodiments.

At least one embodiment of the present disclosure provides an array substrate, manufactured by the abovementioned manufacturing method of the array substrate.

For example, in some examples, a surface of the film included in the array substrate has a film pattern has a same planar shape as the second region.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
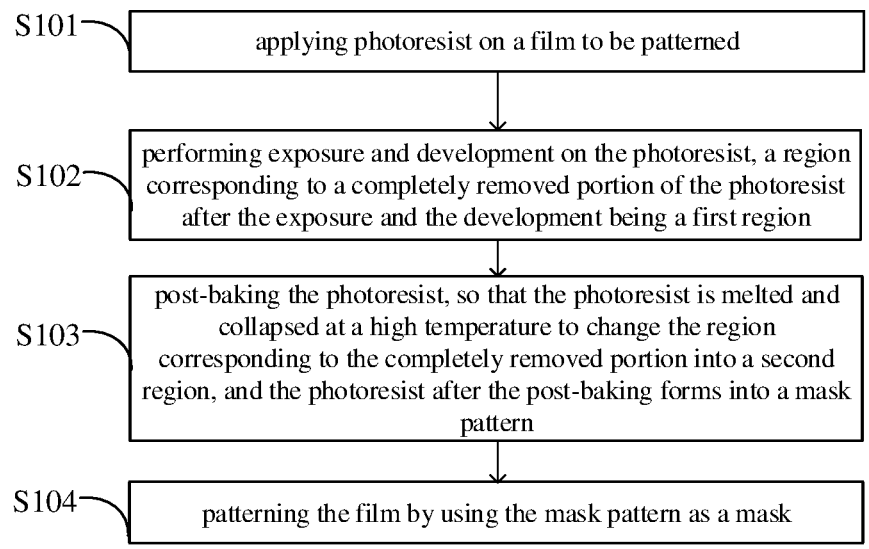
FIG. 1 is a schematic flowchart of a film patterning method provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

In study, the inventor(s) of the present application notices that: in a manufacturing method of an array substrate, the requirement on the critical dimension (DICD) to develop an opening with a small size in photoresist mask is very high. Exposure equipment used to manufacture the opening with a small size in the photoresist mask generally has limit precision. A normal mask method cannot meet the requirements in a case of preparing an opening with a size smaller than the limit precision, and purchase of an exposure equipment with higher precision and manufacture of a mask with higher precision will largely increase the manufacturing costs.

Embodiments of the present disclosure provide a film patterning method, an array substrate and a manufacturing method thereof. The film patterning method includes: applying photoresist on a film to be patterned; performing exposure and development on the photoresist, a region corresponding to a completely removed portion of the photoresist after the exposure and the development being a first region; post-baking the photoresist, so that the photoresist is melted and collapsed at a high temperature to change the region corresponding to the completely removed portion into a second region, and the photoresist after post-baking forms into a mask pattern; and patterning the film by using the mask pattern as a mask. The film patterning method utilizes characteristics of a hot-melt photoresist that melts and collapses at a high temperature after the development and the post-baking, to provide a possibility to form a pattern with a size smaller than the limit precision of an exposure equipment on a film to be patterned. The patterning method is simple in process, and has low costs.

Hereinafter, the film patterning method, the array substrate, and the manufacturing method thereof provided by the embodiments of the present disclosure are described with reference to the accompanying drawings.

An embodiment of the present disclosure provides a film patterning method. FIG. 1 is a schematic flowchart of a film patterning method provided by an embodiment of the present disclosure; FIGS. 2A-2D are schematic diagrams of manufacturing processes of the film patterning method illustrated by FIG. 1. As illustrated by FIG. 1 and FIGS. 2A-2D, the steps and manufacturing processes of the film patterning method provided by an embodiment of the present disclosure include:

S101: applying photoresist on a film to be patterned.

Figure 2A:
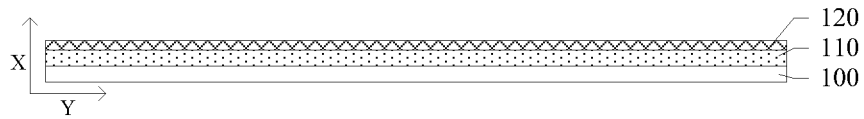
FIGS. 2A-2D are schematic diagrams of manufacturing processes of the film patterning method illustrated by FIG. 1.

For example, as illustrated by FIG. 2A, a film 110 to be patterned can be formed on a base substrate 100 by a method such as deposition or magnetron sputtering. FIG. 2A is a schematic diagram, for example, the film may not be disposed on the base substrate.

For example, the base substrate 100 may be made of one or more materials selected from the group consisting of glass, polyimide, polycarbonate, polyacrylate, polyetherimide, polyethersulfone, polyethylene terephthalate, and polyethylene naphthalate. The present embodiment includes but is not limited thereto.

For example, the film 110 may be an insulating layer. For example, the film 110 may be a gate insulating layer, an interlayer insulating layer, a passivation layer, or an etch barrier layer, and the like, which is not limited in the present embodiment.

For example, the film 110 may include an inorganic material such as an oxide, a sulfide, or a nitride, which is not limited in the present embodiment.

For example, the oxide may include calcium oxide, zinc oxide, copper oxide, titanium dioxide, tin dioxide, etc.; the sulfide may include iron sulfide, copper sulfide, zinc sulfide, tin disulfide, sulfur dioxide, etc.; and the nitride may include silicon nitride, aluminum nitride or the like. The present embodiment includes but is not limited thereto.

For example, the film 110 may also be selected as an organic material, for example, the organic material may be one or a combination of ones selected from the group consisting of polyimide, polyamide, polycarbonate, and epoxy resin. The present embodiment is not limited thereto.

For example, the film 110 may also be a metal layer. For example, a material of the film 110 may be one or more materials selected from the group consisting of aluminum, silver, molybdenum, titanium, platinum, gold, and chromium, which is not limited in the present embodiment. The film 110 can also be other films.

For example, as illustrated by FIG. 2A, applying the photoresist on the film 110 to be patterned includes: applying a thin, uniform, and defect-free photoresist layer 120 on the film 110 by a spin coating method. The present embodiment is not limited thereto, and other coating methods may also be employed.

For example, a coating temperature of the photoresist is generally the same as a room temperature to minimize a temperature fluctuation of the photoresist, thereby reducing a process fluctuation.

S102: performing exposure and development on the photoresist, a region corresponding to a completely removed portion of the photoresist after the exposure and the development being a first region.

For example, a mask (not shown) is covered on the photoresist layer 120, and the photoresist layer 120 covered with the mask is exposed.

For example, the photoresist layer 120 may be irradiated with an electron beam, an ion beam, an X-ray, an ultraviolet ray, or the like. The present embodiment is not limited thereto. For example, the ultraviolet ray may be an ordinary ultraviolet ray having a wavelength in a range of 200 nm to 400 nm, or may be an extreme ultraviolet ray having a wavelength in a range of 10 nm to 14 nm. The present embodiment is not limited thereto.

The present embodiment is described by taking a case where the photoresist layer 120 is exposed by using an ultraviolet ray as an example. For example, an illumination intensity used in the exposure of the photoresist layer 120 is 10 $J/cm^3$-500 $J/cm^3$.

For example, the illumination intensity used in the exposure of the photoresist layer 120 may be 50 $J/cm^3$-80 $J/cm^3$, so as to sufficiently expose the photoresist layer 120, but the present embodiment is not limited thereto.

For example, the illumination intensity used in the exposure of the photoresist layer 120 may be 80 $J/cm^3$-200 $J/cm^3$, 250 $J/cm^3$-500 $J/cm^3$ or 10 $J/cm^3$-40 $J/cm^3$, etc. The illumination intensity in the practical process can be determined according to the thickness of the photoresist layer 120.

For example, the photoresist includes a resin, a photosensitizer, a solvent, and an additive agent. Before the exposure, the photoresist layer 120 is required to be pre-baked, such that the solvent in the photoresist layer 120 can be sufficiently evaporated to dry the photoresist layer 120, enhance the adhesion between the photoresist layer 120 and a surface of the film 110, and improve the line resolution after the exposure. Generally, a temperature of the pre-baking may be set to about 90° C.-120° C. The present embodiment is not limited thereto, but the temperature of the pre-baking cannot be too high to prevent the photoresist layer 120 from melting and collapsing at a high temperature. Therefore, the temperature of the pre-backing in the present embodiment is not greater than 140° C. The pre-baked photoresist layer 120 can be more strongly bonded to the film 110 after the pre-baking.

For example, positive photoresist can be pre-baked in air, while negative photoresist needs to be pre-baked in a nitrogen atmosphere.

For example, the photoresist included in the photoresist layer 120 provided by the present embodiment is positive photoresist, and the positive photoresist includes, for example, a novolac. Upon no dissolution inhibitor being present, the novolac is dissolved in the developer; the photosensitizer in the positive photoresist includes a photo active compound (PAC). For example, the photo active compound may include diazonaphthoquinone (DNQ) or the like, which is not limited in the present embodiment. Before the exposure, diazonaphthoquinone is a strong dissolution inhibitor that reduces the dissolution rate of the resin.

For example, in an ultraviolet exposure process, the photo active compound such as diazonaphthoquinone is chemically decomposed in the positive photoresist by a photochemical reaction, to cut the relationship between a main chain and a dependent chain of the resin polymer, so as to achieve a purpose of weakening the polymer. Such that the photo active compound can become a solubility enhancer. Diazonaphthoquinone will produce a carboxylic acid in the exposure reaction, and the solubility of the carboxylic acid in the developer is high, so that the solubility of the exposed photoresist is increased in the subsequent development process, and solubility rate of the positive photoresist after the exposure is almost 10 times that of the unexposed photoresist. Therefore, after the positive photoresist layer 120 is exposed, the positive photoresist layer 120 in an exposed region is completely removed to form a blank region (a first region 121), and the photoresist layer 120 in an unexposed region remains on the film 110 as a subsequent protective film, and a pattern replicated onto a surface of the film 110 is the same as a pattern on a mask located above the photoresist layer 120.

For example, upon the time for development being insufficient, the photoresist layer 120 in the exposed region is unable to be completely dissolved during the development; upon the development time being too long, the photoresist layer 120 in the unexposed region may be dissolved from an edge of the pattern during the development, such that the edge of the pattern is deteriorated. Therefore, the time for developing the photoresist layer 120 in the present embodiment may be 10 s-500 s, and the present embodiment includes but is not limited thereto.

For example, the developer provided in the present embodiment may be a medium alkali solution. For example, the developer may include one or more materials selected from the group consisting of potassium hydroxide, tetramethylammonium hydroxide, ketone and acetazolamide, which is not limited in the present embodiment.

Figure 2B:
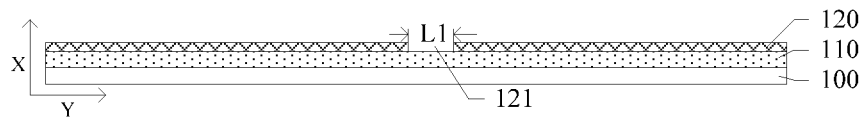

For example, as illustrated by FIG. 2B, a region corresponding to a portion of the photoresist layer 120 that is completely removed after the exposure and the development is a first region 121, the first region 121 is the blank region which is left after the positive photoresist layer 120 in the exposed region being dissolved and removed by a developer.

For example, as illustrated by FIG. 2B, a minimum size of the first region 121 in a direction parallel to a plane where the film 110 is located is a first size L1. It should be noted that, the present embodiment is described by taking a case where the minimum size L1 of a planar pattern of the first region 121 is the minimum size L1 of a contact surface of the first region 121 and the film 110 as an example.

For example, the first size L1 is not less than 3 µm. It should be noted that, the first size L1 cannot be too large, generally, the first size L1 is in the micrometer range. For example, the first size L1 may be 6 µm-10 µm, and the present embodiment includes but is not limited thereto.

For example, a shape of an orthographic projection of a plane of the first region 121 having the first size L1 on the film 110 may include at least one selected from the group consisting of a circle and a line. That is, a planar pattern of the first region 121 may include at least one selected from the group consisting of a circle and a line. The present embodiment includes but is not limited thereto.

S103: post-baking the photoresist, so that the photoresist is melted and collapsed at a high temperature to change the region corresponding to the completely removed portion into a second region, and the photoresist after the post-baking forms into a mask pattern.

In the present embodiment, the photoresist coated on the film to be patterned is a hot-melt photoresist, and the heat-resistant composition in the hot-melt photoresist is less than that of an ordinary photoresist, so that the photoresist melts and collapses at a high temperature in a case of post-baking, without affecting the performance of the photoresist.

Figure 2C:
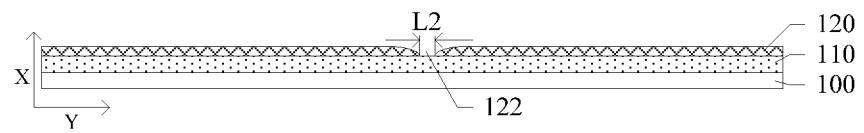

For example, as illustrated by FIGS. 2B and 2C, the photoresist layer 120 having the first region 121 is post-baked, and the post-baking process is performed at a temperature of 150° C.-300° C., to cause the photoresist layer 120 to melt and collapse at a high temperature; that is to say, the photoresist layer 120 around the first region 121 melts and collapses during the post-baking process, such that a side of the photoresist layer 120 being in contact with the film 110 is gathered towards the first region 121, and a side of the photoresist layer 120 away from the film 120 melts and collapses. Therefore, the photoresist layer 120 around the first region 121 flows into the first region 121 after melting and collapsing at the high temperature, so as to change the region corresponding to the completely removed portion of the photoresist into a second region 122.

For example, the photoresist layer 120 having the first region 121 is post-baked, and the post-baking process may be performed at a temperature of 150° C.-200° C., or may be 250° C.-300° C., etc. The present embodiment is not limited herein.

For example, as illustrated by FIG. 2C, a minimum size of the second region 122 in a direction parallel to the plane where the film 110 is located is a second size L2, that is, a minimum size of a side of the second region 122 being in contact with the film 110 is the second size L2, and the second size L2 is smaller than the first size L1.

For example, as illustrated by FIG. 2C, the second size L2 of the second region 122 is 1 µm-2.9 µm, which is smaller than the first size L1 of the first region 121 shown in FIG. 2B.

For example, the second size 122 of the second region 122 may be 1 µm-2.5 µm, or may be 1.5 µm-2 µm, which is not limited in the present embodiment.

For example, a shape of the plane of the second region 122 having the second size L2 may include at least one selected from the group consisting of a circle and a line; that is, a planar shape of the second region 122 may include at least one selected from the group consisting of a circle and a line. It should be noted that, the circle may be an approximately circular shape, and for example, the shape of the plane of the second region 122 having the second size L2 may also be an ellipse or the like.

For example, as illustrated by FIG. 2C, a thickness of the photoresist layer 120 in a direction perpendicular to the film 110, that is, in the X direction is 0.5 μm-10 μm.

For example, the thickness of the photoresist layer 120 in the direction perpendicular to the film 110 may be 1.5 μm-2.2 μm, so that partial photoresist of the photoresist layer 120 around the first region 121 collapses and flows into the first region 121, and the second region 122 having a desired second size L2 is formed.

For example, the thickness of the photoresist layer 120 in the X direction may be 3 μm-5 μm, or the thickness of the photoresist layer 120 in the X direction may also be 7 μm-10 μm, which is not limited in the present embodiment.

For example, the time for post-baking the photoresist layer 120 in the present embodiment is 10 s-500 s.

For example, the photoresist layer 120 is post-baked for 10 s-50 s to cause the photoresist layer 120 around the first region 121 to melt and collapse to form the second region 122 having the desired second size L2.

For example, the time for post-baking the photoresist layer 120 in the present embodiment may be 100 s-200 s or 300 s-500 s, which is not limited in the present embodiment.

For example, an example of the present embodiment is described by taking a case where the film 110 is patterned to form an opening pattern as an example. In the present embodiment, the exposure equipment used for exposing the photoresist layer 120 before forming a pattern having an aperture size of 1 μm-2.9 μm on the film 110 generally has a limit precision of 3 μm, and the partial steps of forming the photoresist layer 120 having the second region 122 include: using a mask plate having an aperture size of 5 μm as a mask of a photoresist layer 120 with a thickness of 0.5 μm-10 μm (for example, the thickness may be 1.5 μm-2.2 μm); performing exposure to the photoresist layer 120, and light intensity during the exposure being 10 J/cm³-500 J/cm³, for example, the light intensity during the exposure may be 50 J/cm³-80 J/cm³; after exposure, performing development on the photoresist layer 120, and the time for development being selected from 10 s to 500 s; performing post-baking to the developed photoresist layer 120, and a temperature during the post-backing process being selected from 150° C. to 300° C., and the time for the post-baking time being selected from 10 s to 500 s, for example, the time for post-baking is 10 s-50 s. After the abovementioned exposure, development, and post-baking, the second region 122 having the second size L2 of 1 μm-2.9 μm is formed on the photoresist layer 120. Therefore, the film patterning method utilizes the characteristics of a hot-melt photoresist that melts and collapses at a high temperature after development and post-baking, to provide a possibility to form a pattern with a size smaller than the limit precision of an exposure equipment on a film to be patterned. The patterning method is simple in process, and has low costs.

S104: patterning the film by using the mask pattern as a mask.

Figure 2D:
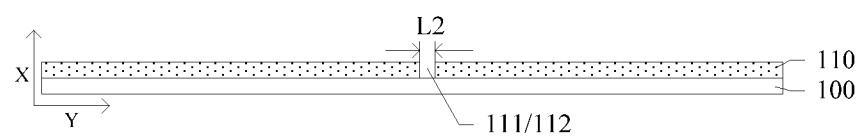

For example, as illustrated by FIG. 2D, the film 110 is patterned by using the photoresist layer 120 having the second region 122 as a mask to form a small-sized pattern 111/112.

For example, the film 110 can be patterned to form an opening 111 having the second size L2, that is, a pore size of the opening 111 is 1 μm-2.9 μm, and the embodiment includes but is not limited thereto.

For example, the film 110 can also be patterned to form a line shape 112 having a minimum size of the second size L2, that is, a size of a short edge of the line shape 112 (a length of an edge extending in the Y direction) is 1 μm-2.9 μm, and the present embodiment includes but is not limited thereto. It should be noted that, FIGS. 2A-2D schematically illustrate the formation of the small-sized pattern 111/112, but the present embodiment is not limited thereto, and a plurality of small-sized patterns 111/112 can be formed.

Figure 3A:
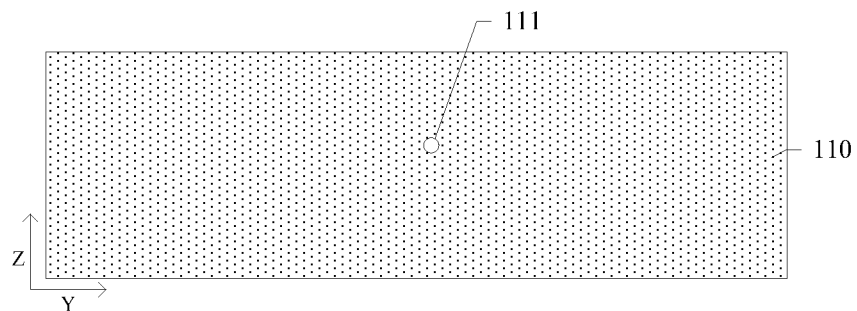
FIG. 3A is a partial plan view of a film provided by an example of an embodiment of the present disclosure.
Figure 3B:
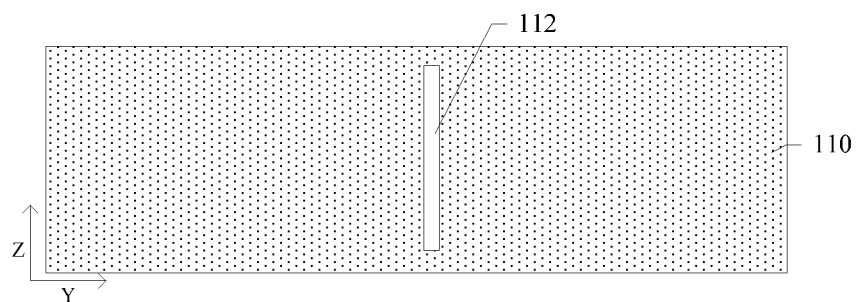
FIG. 3B is a partial plan view of a film provided by another example of an embodiment of the present disclosure.

For example, FIG. 3A is a partial plan view of a film provided by an example of an embodiment of the present disclosure, and FIG. 3B is a partial plan view of a film provided by another example of an embodiment of the present disclosure. As illustrated by FIG. 3A, the pattern formed on the film 110 by using the mask pattern having the second region 122 as a mask is an opening 111.

For example, a planar shape of the opening 111 in the YZ plane may be a standard circular shape or an approximately circular shape, and the embodiment includes but is not limited thereto.

For example, the planar shape of the opening 111 in the YZ plane may also be an irregular shape or the like. It should be noted that, FIG. 3A schematically shows one opening 111. The embodiment is not limited thereto, and a plurality of openings 111 can be formed.

For example, upon the film 110 being a gate insulating layer and/or an interlayer insulating layer, the photoresist layer 120 having the second region 122, i.e., the mask pattern, can be utilized as a mask to form a contact hole (i.e., the opening 111) for connecting a source electrode and a drain electrode with an active layer of a thin film transistor. Herein, the thin film transistor is a top gate type.

For example, upon the film 110 being an etch barrier layer, the photoresist layer 120 having the second region 122 can be utilized as a mask to form a contact hole (i.e., the opening 111) for connecting a source electrode and a drain electrode with an active layer of a thin film transistor.

For example, upon the film 110 being a passivation layer, the photoresist layer 120 having the second region 122 can be utilized as a mask to form a via hole (i.e., the opening 111) for exposing a drain electrode of a thin film transistor and a common electrode line, and the exposed drain electrode can be electrically connected with a subsequently formed pixel electrode through the via hole, the exposed common electrode line can be electrically connected with a subsequently formed common electrode through the via hole, and the present embodiment includes but is not limited thereto.

For example, the film 110 may also be other insulating layers or metal layers, etc., which is not limited in the present embodiment.

For example, as illustrated by FIG. 3B, the planar pattern formed on the film 110 by using the photoresist layer 120 having the second region 122 as a mask may also have a line shape 112, that is, a groove or the like can be formed in the film 110. It should be noted that, FIG. 3B schematically shows one line shape 112. The present embodiment is not limited thereto, and a plurality of line shapes 112 can be formed.

Figure 4:
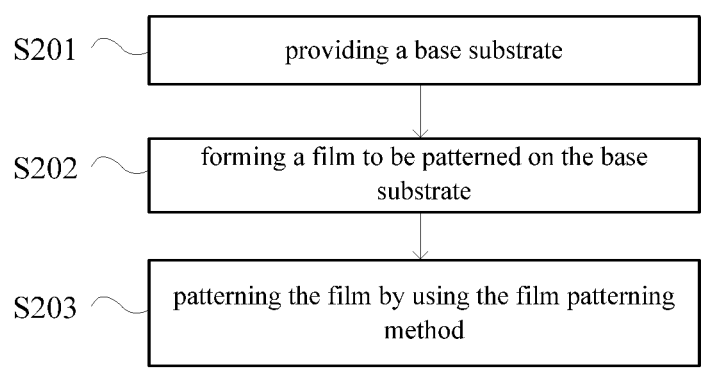
FIG. 4 is a flowchart of a manufacturing method of an array substrate provided by an embodiment of the present disclosure.

An embodiment of the present disclosure provides a manufacturing method of an array substrate. FIG. 4 is a schematic flowchart of a manufacturing method of an array substrate according to an embodiment of the present disclosure. As illustrated by FIG. 4, the manufacturing method includes:

S201: providing a base substrate.

For example, the base substrate may be made of one or more materials selected from the group consisting of glass, polyimide, polycarbonate, polyacrylate, polyetherimide, polyethersulfone, polyethylene terephthalate, and polyethylene naphthalate. The embodiment includes but is not limited thereto.

S202: forming a film to be patterned on the base substrate.

For example, the film to be patterned may be formed on the base substrate by a method such as deposition or magnetron sputtering.

For example, the film may be an insulating layer. For example, the film may be a gate insulating layer, an interlayer insulating layer, a passivation layer or an etch barrier layer, and the like, which is not limited in the present embodiment.

For example, the film may include an inorganic material, such as a metal oxide, a metal sulfide, or a metal nitride, which is not limited in the present embodiment.

For example, the film may also be an organic material, and the organic material may include, for example, one or a combination of ones selected from the group consisting of polyimide, polyamide, polycarbonate, and epoxy resin, and the present embodiment is not limited thereto.

For example, the film may also be a metal layer. For example, the material of the film may be one or more materials selected from the group consisting of aluminum, silver, molybdenum, titanium, platinum, gold, and chromium. The present embodiment is not limited thereto, for example, the film can be other films.

S203: patterning the film by a film patterning method.

In the present embodiment, the film is patterned by using any film patterning method provided by the abovementioned embodiments, and the specific patterning processes and the parameters such as the shape and the size of the small-sized pattern obtained by patterning the film will not be repeated herein.

The manufacturing method of an array substrate utilizes the characteristics of a hot-melt photoresist that melts and collapses at a high temperature after development and post-baking, to provide a possibility to form a pattern with a size smaller than the limit precision of an exposure equipment on a film to be patterned. The patterning method is simple in process, and has low costs.

An embodiment of the present disclosure provides an array substrate, and the array substrate is manufactured by the manufacturing method of the array substrate provided by the abovementioned embodiments.

For example, a surface of a film included in the array substrate includes a film pattern having the substantially same shape with a planar shape of the second region of the photoresist layer, and a minimum size of the film pattern in a direction parallel to the plane where the film is located is a second size, i.e., a minimum size of the second region in the direction parallel to the plane where the film is located.

For example, the minimum size of the film pattern in the direction parallel to the plane where the film is located is 1 µm-2.9 µm.

For example, the minimum size of the film pattern in the direction parallel to the plane where the film is located may be 1 µm-2.5 µm, or may also be 1.5 µm-2 µm, which is not limited in the present embodiment.

For example, the array substrate can be applied to a display device such as a liquid crystal display device, an organic light emitting diode (OLED) display device, and any products or components having a display function and including the display device, such as a television, a digital camera, a mobile phone, a watch, a tablet, a notebook computer, and a navigator. The present embodiment is not limited thereto.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A film patterning method, comprising:
    applying photoresist on a film to be patterned;
    performing exposure and development on the photoresist, a region corresponding to a completely removed portion of the photoresist after the exposure and the development being a first region;
    post-baking the photoresist, so that the photoresist is melted and collapsed to change the region corresponding to the completely removed portion into a second region, the second region exposing the film, wherein the photoresist, after the post-baking, forms into a mask pattern; and
    patterning the film by using the mask pattern as a mask, wherein a size of the first region in a direction parallel to a plane where the film is located is a first size, a size of the second region in the direction parallel to the plane where the film is located is a second size, the second size is smaller than the first size, and a planar shape of the first region and the second region comprises at least one selected from the group consisting of a circle and a line.

2. The film patterning method according to claim 1, wherein the photoresist is positive photoresist.

3. The film patterning method according to claim 1, wherein, during the post-baking, the post-baking has a temperature of 150° C.-300° C. to cause the photoresist to melt and collapse.

4. The film patterning method according to claim 3, wherein, during the post-baking, a time for the post-baking is 10 s-500 s.

5. The film patterning method according to claim 4, wherein, during the post-baking, the time for the post-baking is 10 s-50 s.

6. The film patterning method according to claim 1, wherein, upon the planar shape of the second region being the circle, the second size is a pore size of the circle, and the second size is 1 µm-2.9 µm;
    upon the planar shape of the second region being the line, the second size is a size of a short edge of the line, and the second size is 1 µm-2.9 µm.

7. The film patterning method according to claim 6, wherein, upon the planar shape of the first region being the circle, the first size is a pore size of the circle, and the first size is not less than 3 µm;
   upon the planar shape of the first region being the line, the first size is a size of a short edge of the line, and the first size is not less than 3 µm.

8. The film patterning method according to claim 1, wherein the photoresist has a thickness of 0.5 µm-10 µm in a direction perpendicular to the film.

9. The film patterning method according to claim 8, wherein the thickness of the photoresist is 1.5 µm-2.2 µm in the direction perpendicular to the film.

10. The film patterning method according to claim 1, wherein a light intensity used in the exposure is 10 $J/cm^3$-500 $J/cm^3$.

11. A manufacturing method of an array substrate, comprising:
   providing a base substrate;
   forming a film to be patterned on the base substrate; and
   patterning the film by using the film patterning method according to claim 1.

12. An array substrate, manufactured by the manufacturing method of the array substrate according to claim 11.

13. The array substrate according to claim 12, wherein a surface of the film included in the array substrate has a film pattern having a same planar shape as the second region.

* * * * *